US011294207B2

(12) United States Patent
Kim et al.

(10) Patent No.: US 11,294,207 B2
(45) Date of Patent: Apr. 5, 2022

(54) OPTICAL MODULATOR AND BEAM STEERING SYSTEM INCLUDING THE SAME

(71) Applicant: SAMSUNG ELECTRONICS CO., LTD., Suwon-si (KR)

(72) Inventors: Sunil Kim, Osan-si (KR); Junghyun Park, Seoul (KR); Duhyun Lee, Yongin-si (KR); Byunggil Jeong, Anyang-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/848,433

(22) Filed: Apr. 14, 2020

(65) Prior Publication Data

US 2021/0088812 A1 Mar. 25, 2021

(30) Foreign Application Priority Data

Sep. 23, 2019 (KR) .................. 10-2019-0116871
Oct. 14, 2019 (KR) .................. 10-2019-0127160

(51) Int. Cl.
*G02F 1/015* (2006.01)
*H01S 5/00* (2006.01)
*H01S 5/183* (2006.01)

(52) U.S. Cl.
CPC ............ *G02F 1/015* (2013.01); *H01S 5/0085* (2013.01); *H01S 5/18375* (2013.01); *G02F 2202/10* (2013.01)

(58) Field of Classification Search
CPC .... G02F 1/015; G02F 2202/10; H01S 5/0085; H01S 5/18375
See application file for complete search history.

(56) References Cited

U.S. PATENT DOCUMENTS

| 10,274,756 | B2 * | 4/2019 | Kim | .................. | H01L 29/24 |
| 10,303,038 | B2 * | 5/2019 | Kim | .................. | G02F 1/133602 |
| 2017/0153528 | A1 * | 6/2017 | Kim | .................. | G02F 1/133602 |
| 2018/0059505 | A1 * | 3/2018 | Kyoung | .................. | G02F 1/292 |
| 2018/0136537 | A1 * | 5/2018 | Kim | .................. | G02F 1/292 |
| 2018/0196138 | A1 * | 7/2018 | Lee | .................. | G01S 7/481 |

(Continued)

FOREIGN PATENT DOCUMENTS

| EP | 3324235 A1 | 5/2018 |
| EP | 3581992 A1 | 12/2019 |
| EP | 3650930 A1 | 5/2020 |

(Continued)

OTHER PUBLICATIONS

Communication dated Sep. 18, 2020 issued by the European Patent Office in European Patent Office in European Application No. 20171307.0.

*Primary Examiner* — Peter Radkowski
(74) *Attorney, Agent, or Firm* — Sughrue Mion, PLLC (57) ABSTRACT

Provided is an optical modulator including a plurality of unit cells, an active layer including a plurality of refractive index changing areas that are separated from each other, each of the plurality of refractive index changing areas having a refractive index that changes based on an electrical signal applied thereto, a plurality of antenna patterns provided over the active layer, and a mirror layer provided under the active layer opposite to the plurality of antenna patterns.

29 Claims, 6 Drawing Sheets (56) References Cited

U.S. PATENT DOCUMENTS

2018/0321518 A1* 11/2018 Atwater ................ G02F 1/0018
2019/0057512 A1*  2/2019 Han ..................... G06F 1/1639

FOREIGN PATENT DOCUMENTS

| KR | 10-2017-0062093 A | 6/2017 |
| KR | 10-2017-0068372 A | 6/2017 |
| KR | 10-2018-0055298 A | 5/2018 |
| KR | 10-2019-0013107 A | 2/2019 |

* cited by examiner

OPTICAL MODULATOR AND BEAM STEERING SYSTEM INCLUDING THE SAME

CROSS-REFERENCE TO RELATED APPLICATIONS

This application claims priority from Korean Patent Application Nos. 10-2019-0116871 and 10-2019-0127160, filed on Sep. 23, 2019 and Oct. 14, 2019, respectively, in the Korean Intellectual Property Office, the disclosures of which are incorporated herein in their entireties by reference.

BACKGROUND

1. Field

Example embodiments of the present disclosure relate to an optical modulator and a beam steering system including the same.

2. Description of Related Art

In order to steer a laser beam to a desired position, a laser emitting portion may be mechanically rotated or an optical phased array (OPA) method may be used to use the interference of a laser beam bundle output from a plurality of unit cells or a plurality of waveguides. In the OPA method, a laser beam may be steered by electrically or thermally controlling the unit cells or the waveguides.

SUMMARY

One or more example embodiments provide an optical modulator and a beam steering system including the same.

Additional aspects will be set forth in part in the description which follows and, in part, will be apparent from the description, or may be learned by practice of the presented embodiments of the disclosure.

According to an aspect of an example embodiment, there is provided an optical modulator including a plurality of unit cells, an active layer including a plurality of refractive index changing areas that are separated from each other, each of the plurality of refractive index changing areas having a refractive index that changes based on an electrical signal applied thereto, a plurality of antenna patterns provided over the active layer, and a mirror layer provided under the active layer opposite to the plurality of antenna patterns.

A distance between adjacent refractive index changing areas of the plurality of refractive index changing areas is within a range of 0.1 μm to 0.5 μm.

A distance between adjacent refractive index changing areas of the plurality of refractive index changing areas may be equal to or less than a size of each of the plurality of refractive index changing areas.

The distance between adjacent refractive index changing areas of the plurality of refractive index changing areas may be less than the width of each of the plurality of refractive index changing areas.

The distance between adjacent refractive index changing areas of the plurality of refractive index changing areas may be less than ½ of the width of each of the plurality of refractive index changing areas.

A distance between adjacent refractive index changing areas of the plurality of refractive index changing areas may be equal to or less than a distance between adjacent antenna patterns of the plurality of antenna patterns.

The plurality of refractive index changing areas may be provided one-dimensionally or two-dimensionally.

The plurality of refractive index changing areas may be electrically separated from each other.

The plurality of refractive index changing areas may be electrically connected to each other.

The plurality of refractive index changing areas may include an oxide semiconductor.

The oxide semiconductor may include at least one of indium-tin-oxide (ITO), indium-zinc-oxide (IZO), gallium-indium-zinc-oxide (GIZO), aluminum-zinc-oxide (AZO), gallium-zinc-oxide (GZO), and zinc oxide (ZnO).

An insulating material may be provided between each of the plurality of refractive index changing areas.

The mirror layer may include a metal mirror corresponding to the plurality of unit cells.

The mirror layer may include a plurality of metal mirrors that are separated from each other and correspond to the plurality of unit cells, respectively.

The mirror layer may include at least one of silver (Ag), gold (Au), aluminum (Al), and platinum (Pt).

The optical modulator may further include an insulating layer provided between the active layer and the plurality of antenna patterns or between the active layer and the mirror layer, or both between the active layer and the plurality of antenna patterns and between the active layer and the mirror layer.

The insulating layer may include a material having a resistance equal to or greater than 1 MΩ.

The insulating layer may include silicon dioxide ($SiO_2$), silicon nitride (SiN), aluminum oxide ($Al_2O_3$), zirconium dioxide ($ZrO_2$), hafnium oxide ($HfO_2$), or a combination thereof.

At least one antenna pattern of the plurality of antenna patterns may be provided to correspond to each of the plurality of unit cells, respectively.

The plurality of antenna patterns may include at least one of silver (Ag), gold (Au), aluminum (Al), platinum (Pt), titanium nitride (TiN), and tantalum nitride (TaN).

The optical modulator may further include a plurality of unit cell drivers provided under the mirror layer and configured to apply an electrical signal to the plurality of unit cells, respectively.

According to an aspect of an example embodiment, there is provided a beam steering system including a laser light source configured to emit a laser beam, an optical modulator configured to steer the laser beam received from the laser light source, the optical modulator including a plurality of unit cells, and a detector configured to detect the steered laser beam, wherein the optical modulator includes an active layer including a plurality of refractive index changing areas that respectively corresponds to the plurality of unit cells and are separated from each other, each of the plurality of refractive index changing areas having a refractive index that changes based on an electrical signal applied thereto, a plurality of antenna patterns provided over the active layer, and a mirror layer provided under the active layer opposite to the plurality of antenna patterns.

The plurality of refractive index changing areas may be provided one-dimensionally or two-dimensionally.

A distance between adjacent refractive index changing areas of the plurality of refractive index changing areas may be equal to or less than a width of each of the plurality of refractive index changing areas.

A distance between adjacent refractive index changing areas of the plurality of refractive index changing areas may be equal to or less than a distance between adjacent antenna patterns of the plurality of antenna patterns.

The mirror layer may include a metal mirror corresponding to the plurality of unit cells.

The mirror layer may include a plurality of metal mirrors that are separated from each other and correspond to the plurality of unit cells, respectively.

The optical modulator may include an insulating layer provided between the active layer and the plurality of antenna patterns or between the active layer and the mirror layer, or both between the active layer and the plurality of antenna patterns and between the active layer and the mirror layer.

The optical modulator may further include a plurality of unit cell drivers provided under the mirror layer and configured to apply an electrical signal to the plurality of unit cells, respectively.

According to an aspect of an example embodiment, there is provided an optical modulator including a plurality of unit cells, an active layer including a plurality of refractive index changing areas that are separated from each other, each of the plurality of refractive index changing areas having a refractive index that changes based on an electrical signal, a plurality of antenna patterns provided over the active layer, and a mirror layer provided under the active layer opposite to the plurality of antenna patterns, wherein a thickness of each of the plurality of refractive index changing areas is less than a thickness of the mirror layer

BRIEF DESCRIPTION OF THE DRAWINGS

The above and/or other aspects, features, and advantages of example embodiments will be more apparent from the following description taken in conjunction with the accompanying drawings, in which.

DETAILED DESCRIPTION

Reference will now be made in detail to example embodiments of which are illustrated in the accompanying drawings, wherein like reference numerals refer to like elements throughout. In this regard, the example embodiments may have different forms and should not be construed as being limited to the descriptions set forth herein. Accordingly, the example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

In the drawings, the sizes of components may be exaggerated for clarity. The disclosure may have different forms and should not be construed as limited to the example embodiments set forth herein.

For example, it will also be understood that when a layer is referred to as being "on" another layer or a substrate, it can be directly on the other layer or the substrate, or intervening layers may also be present therebetween. As used herein, the singular forms "a," "an," and "the" are intended to include the plural forms as well, unless the context clearly indicates otherwise. Throughout the specification, when a portion "includes" an element, another element may be further included, rather than excluding the existence of the other element, unless otherwise described.

The use of the term "the" and similar referents in the context of describing the disclosure is to be construed to cover both the singular and the plural. Also, the steps of all methods described herein may be performed in any suitable order unless otherwise indicated herein or otherwise clearly contradicted by context. The present disclosure is not limited to the described order of the steps. The use of any and all examples, or exemplary language provided herein is intended merely to better illuminate the disclosure and does not pose a limitation on the scope of the disclosure unless otherwise claimed.

Figure 1:
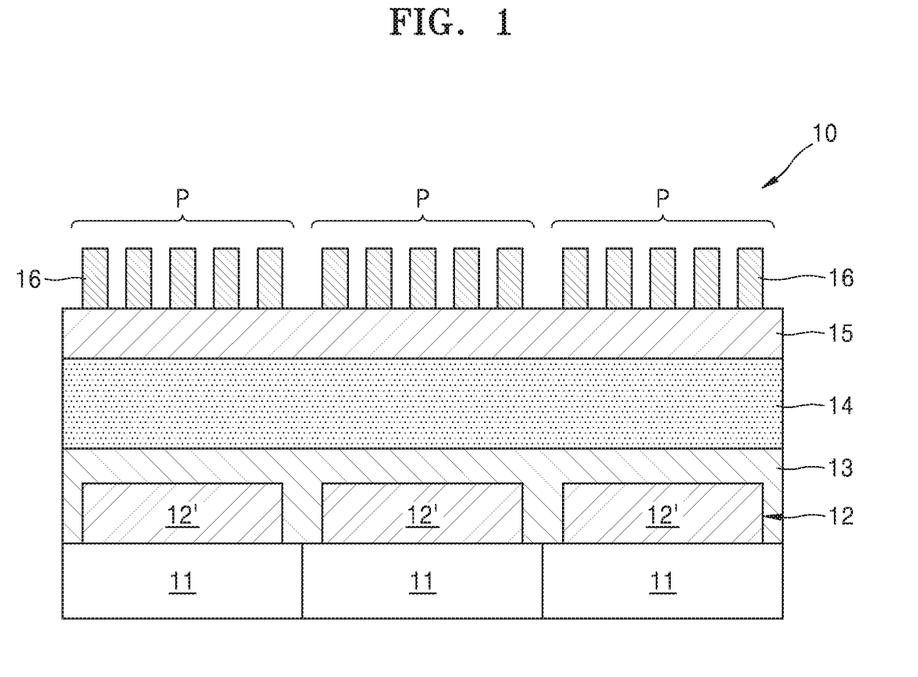
FIG. 1 is a cross-sectional view illustrating a general optical modulator.

FIG. 1 is a cross-sectional view illustrating a general optical modulator 10. In FIG. 1, only three unit cells P from among a plurality of unit cells P constituting the general optical modulator 10 are illustrated for convenience of explanation.

Referring to FIG. 1, the general optical modulator 10 includes an active layer 14 having a refractive index changed according to an electrical signal, a plurality of antenna patterns 16 provided over the active layer 14, and a mirror layer 12 provided under the active layer 14. The mirror layer 12 may include a plurality of metal mirrors 12' that are structurally separated from one another, and the metal mirrors 12' are provided to respectively correspond to the unit cells P. A first insulating layer 13 is provided between the active layer 14 and the mirror layer 12, and a second insulating layer 15 is provided between the active layer 14 and the antenna patterns 16. A plurality of unit cell drivers 11 for applying an electrical signal to the active layer 14 are provided under the mirror layer 12.

In a structure of FIG. 1, when an electrical signal is applied between the metal mirror 12' and the antenna patterns 16 by the unit cell driver 11 in a predetermined unit cell P, a refractive index of a portion of the active layer 14 corresponding to the predetermined unit cell P is changed due to the electrical signal. However, the general optical modulator 10 has problems in that because the metal mirrors 12' have to be formed of aluminum (Al) or AlNd instead of a material having a high reflectance such as gold (Au) due to a patterning process of forming the metal mirrors 12', reflection efficiency is reduced. Also, electrical leakage may occur due to an edge structure of the metal mirrors 12' that are structurally separated from one another.

Figure 2:
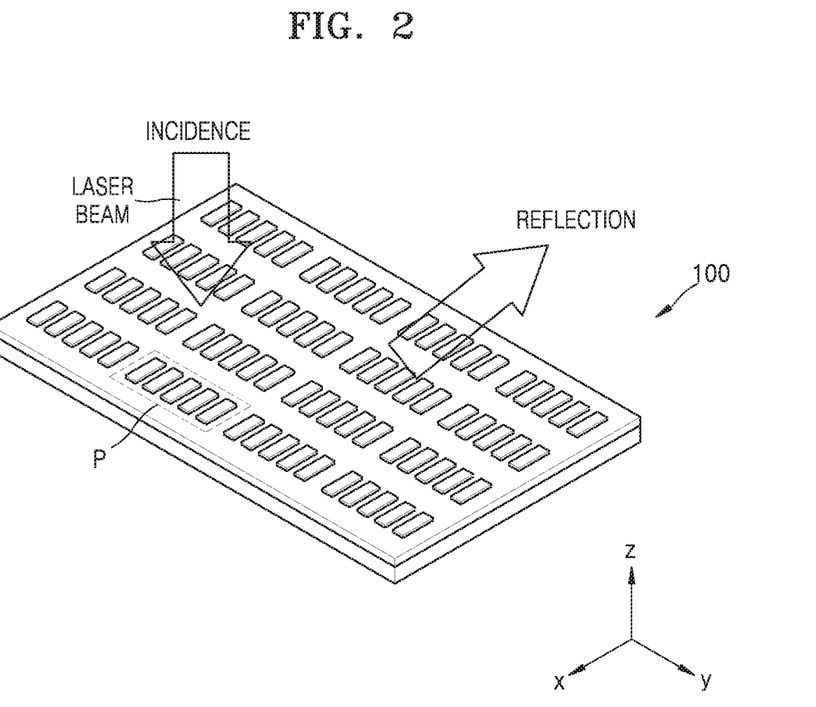
FIG. 2 is a perspective view of an optical modulator according to an example embodiment.

FIG. 2 is a perspective view of an optical modulator 100 according to an example embodiment.

Referring to FIG. 2, the optical modulator 100 may include the plurality of unit cells P that are arranged in a predetermined pattern. The plurality of unit cells P may be arranged in a two-dimensional (2D) pattern. However, embodiments are not limited thereto, and the unit cells P may be arranged in a one-dimensional (1D) pattern. The unit cells P constituting the optical modulator 100 may steer a laser beam incident on the optical modulator 100 in a desired direction by controlling a phase profile formed according to a change in a refractive index as described below. When the unit cells P are arranged in a 2D pattern, a laser beam may be steered in two directions. Also, when the unit cells P are arranged in a 1D pattern, a laser beam may be steered in one direction. A size of each of the unit cells P, for example, a size in a y-direction in FIG. 2 of each of the unit cells may be less than a wavelength of an incident laser beam. As a size of the unit cell P decreases, a field of view (FOV) may increase.

Figure 3:
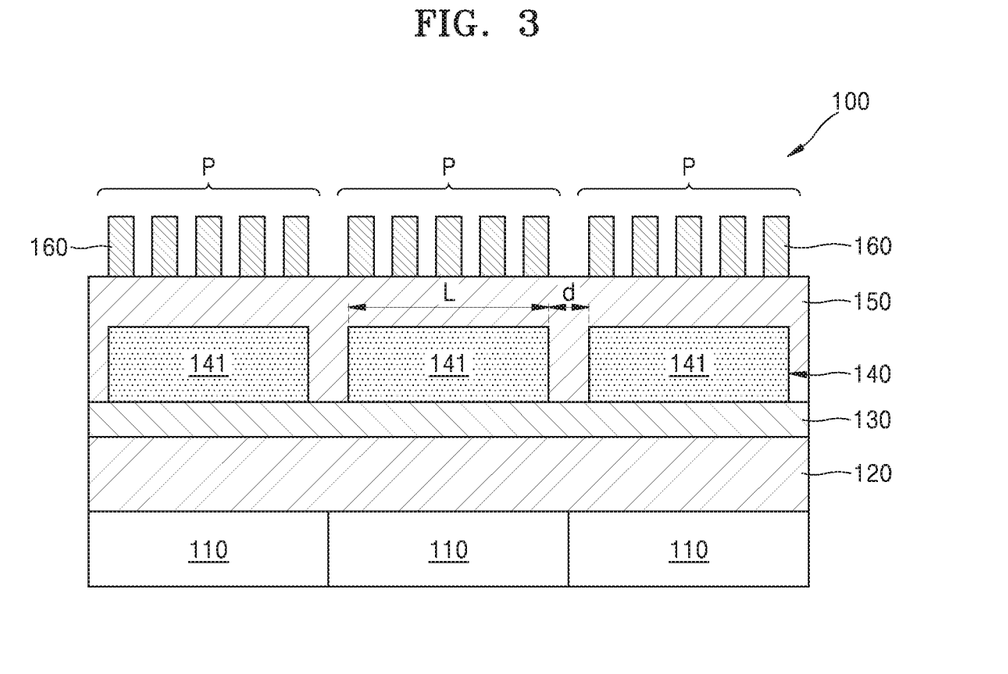
FIG. 3 is a cross-sectional view of the optical modulator of FIG. 2.

FIG. 3 is a cross-sectional view of the optical modulator 100 of FIG. 2. In FIG. 3, as an example, only three unit cells P from among the plurality of unit cells P constituting the optical modulator 100 are illustrated for convenience of explanation.

Referring to FIG. 3, the optical modulator 100 includes an active layer 140, a plurality of antenna patterns 160 provided over the active layer 140, and a mirror layer 120 provided under the active layer 140. Unit cell drivers 110 for applying an electrical signal to the active layer 140 are provided under the mirror layer 120. A first insulating layer 130 is provided between the active layer 140 and the mirror layer 120, and a second insulating layer 150 is provided between the active layer 140 and the antenna patterns 160.

The active layer 140 includes a plurality of refractive index changing areas 141 having a refractive index changed according to an electrical signal. The refractive index changing areas 141 may be structurally separated from one another. For example, the refractive index changing areas 141 may be provided on the first insulating layer 130 to be structurally spaced apart by a predetermined interval d.

The distance d by which the refractive index changing areas 141 are structurally separated may be equal to or less than a size L of each of the refractive index changing areas 141. For example, the distance d by which the refractive index changing areas 141 are structurally separated may be less than ½, ⅓, or ⅕ of the size L of each of the refractive index changing areas 141.

The size L of each of the refractive index changing areas 141 may range from about 0.2 µm to about 10 µm. For example, the size L of each of the refractive index changing areas 141 may be about 4.5 µm. The distance d by which the refractive index changing areas 141 are structurally separated may range, for example, from about 0.1 µm to about 0.5 µm. For example, the distance d by which the refractive index changing areas 141 are structurally separated may be about 0.5 µm. In this case, d/L may be about ⅑.

The distance d by which the refractive index changing areas 141 are structurally separated may be equal to or less than an interval between the antenna patterns 160, but embodiments are not limited thereto. When the distance d by which the refractive index changing areas 141 are separated is equal to or less than an interval between the antenna patterns 160, fixed-pattern noise due to a separation structure may be reduced.

The refractive index changing areas 141 may be electrically separated from one another. However, embodiments are not limited thereto, and the refractive index changing areas 141 may be electrically connected to one another.

The plurality of refractive index changing areas 141 may be provided to respectively correspond to the unit cells P. In detail, when the unit cells P are arranged in a 2D pattern, the plurality of refractive index changing areas 141 may be provided in a 2D pattern, and when the unit cells P are arranged in a 1D pattern, the plurality of refractive index changing areas 141 may be arranged in a 1D pattern.

A carrier density of each of the refractive index changing areas 141 may be changed by an electrical signal such as a voltage, and the changed carrier density may change a refractive index of each of the refractive index changing areas 141 to form a predetermined refractive index profile. The changed refractive index of the refractive index changing area 141 may change a phase of light incident on the refractive index changing area 141 to form a phase profile, and thus when such a phase profile is controlled by changing a refractive index, a laser beam incident on the optical modulator 100 may be steered.

The refractive index changing areas 141 may include a material having a carrier density changed according to an applied electrical signal. For example, the refractive index changing areas 141 may include an oxide semiconductor. For example, the refractive index changing areas 141 may include a transparent conductive oxide (TCO). The TCO may include at least one of, for example, indium-tin-oxide (ITO), indium-zinc-oxide (IZO), gallium-indium-zinc-oxide (GIZO), aluminum-zinc-oxide (AZO), gallium-zinc-oxide (GZO), and ZnO. However, embodiments are not limited thereto.

The refractive index changing areas 141 may be formed by patterning an oxide semiconductor deposited to a very small thickness. The refractive index changing areas 141 may have a thickness much smaller than a thickness of the mirror layer 120. For example, the refractive index changing areas 141 may be formed to have a thickness equal to or less than about 10 nm. However, embodiments are not limited thereto.

In general, because refractive index change efficiency increases as a carrier density increases, the refractive index changing areas 141 may include, for example, a material having a relatively high carrier density. When the refractive index changing areas 141 have a relatively high carrier density, refractive index change efficiency may be improved, and thus a maximum phase of a laser beam may be increased.

The plurality of antenna patterns 160 are provided over the active layer 140 including the plurality of refractive index changing areas 141. The antenna patterns 160 are arranged over the active layer 140 to be spaced apart by a predetermined interval.

At least one antenna pattern 160 may be provided to correspond to one unit cell P. In FIG. 3, five antenna patterns 160 are provided to correspond to one unit cell P. However, embodiments are not limited thereto, and various numbers of antenna patterns 160 may be provided to correspond to one unit cell P. The antenna patterns 160 constituting one unit cell P are electrically connected to one another and are electrically separated from the antenna patterns constituting an adjacent unit cell P.

The antenna patterns 160 may perform beam steering by forming a metasurface. The antenna patterns 160 may include a metal or an alloy including at least one of Ag, Au, Al, and Pt. Also, the antenna patterns 160 may include a metal nitride such as titanium nitride (TiN) or tantalum nitride (TaN). The above-described materials are merely examples, and the antenna patterns 160 may include various other materials.

An interval between the antenna patterns 160 may be equal to or less than, for example, ½ or ⅓ of a wavelength of an incident laser beam. For example, when a wavelength of an incident laser beam is 1500 nm, an interval between the antenna patterns 160 may be equal to or less than 500 nm. However, embodiments are not limited thereto. The antenna patterns 160 may be arranged at regular intervals, but embodiments are not limited thereto, and the antenna patterns 160 may be arranged at irregular intervals.

The mirror layer 120 is provided under the active layer 140 including the plurality of refractive index changing areas 141. The mirror layer 120 may reflect an incident laser beam, thereby improving the optical efficiency of the optical modulator 100. Also, the mirror layer 120 may function as an electrode for applying a voltage to the refractive index changing areas 141 of the active layer 140.

The mirror layer 120 may include a metal mirror structurally integrally formed to correspond to the plurality of unit cells P. The mirror layer 120 may include at least one of Ag, Au, Al, and Pt. However, embodiments are not limited thereto, and the mirror layer 120 may include various materials.

The first insulating layer 130 may be provided between the active layer 140 and the mirror layer 120. The second insulating layer 150 may be provided between the active layer 140 and the antenna patterns 160. The second insulating layer 150 may be filled between the plurality of refractive index changing areas 141 that are structurally separated from one another.

The first insulating layer 130 and the second insulating layer 150 first insulating layer 130 and the second insulating layer 150 may include various kinds of insulating materials. For example, the first insulating layer 130 and the second insulating layer 150 may include an insulating material having a resistance equal to or greater than 1 MΩ. For example, the first insulating layer 130 and the second insulating layer 150 may include silicon dioxide ($SiO_2$), silicon nitride (SiN), aluminum oxide ($Al_2O_3$), zirconium dioxide ($ZrO_2$), hafnium oxide ($HfO_2$), or a combination thereof. However, embodiments are not limited thereto, and the first insulating layer 130 and the second insulating layer 150 may include various other insulating materials.

The plurality of unit cell drivers 110 that are provided to correspond to the unit cells P and independently drive the unit cells P are located under the mirror layer 120. The unit cell drivers 110 may change a refractive index of the refractive index changing areas 141 by applying an electrical signal to the refractive index changing areas 141 in the active layer 140. Each of the unit cell drivers 110 may include, for example, one transistor and one capacitor.

In order to change a refractive index by applying an electrical signal to the refractive index changing area 141 corresponding to one unit cell P, the unit cell driver 110 may apply an electrical signal between the mirror layer 120 and the antenna pattern 160 located in the unit cell P, or may apply an electrical signal between the refractive index changing area 141 and the antenna pattern 160 located in the unit cell P. In this case, the refractive index changing areas 141 may be provided to be electrically separated from one another or electrically connected to one another. Also, the unit cell driver 110 may apply an electrical signal between the refractive index changing area 141 and the mirror layer 120 located in the unit cell P. In this case, the refractive index changing areas 141 may be provided to be electrically separated from one another.

In this structure, when the unit cells P are independently driven by the unit cell drivers 110, an electrical signal is applied to the refractive index changing areas 141, and thus, a refractive index of each of the refractive index changing areas 141 may be changed. The changed refractive index of the refractive index changing area 141 may change a phase of light incident on the refractive index changing area 141 to form a predetermined phase profile. Accordingly, a laser beam incident on the optical modulator 100 may be steered in a desired direction by controlling a phase profile by changing a refractive index of each of the refractive index changing areas 141 over time.

In the optical modulator 100 according to the example embodiment, the active layer 140 includes the plurality of refractive index changing areas 141 that are structurally separated. Because the refractive index changing areas 141 are formed to have a thickness, for example, a thickness equal to or less than about 10 nm, that is much smaller than a thickness of the mirror layer 120, a patterning process may be more easily performed, and electrical leakage according to an edge structure may be reduced or prevented due to a relatively small thickness of the refractive index changing areas 141.

Also, because a metal mirror integrally formed to commonly correspond to the plurality of unit cells P is used as the mirror layer 120, a separate patterning process for forming the mirror layer 120 is not required, and because the mirror layer 120 may be formed of a metal material having a relatively high reflectance such as Au, the optical properties of the optical modulator 100 may be improved.

Figure 4:
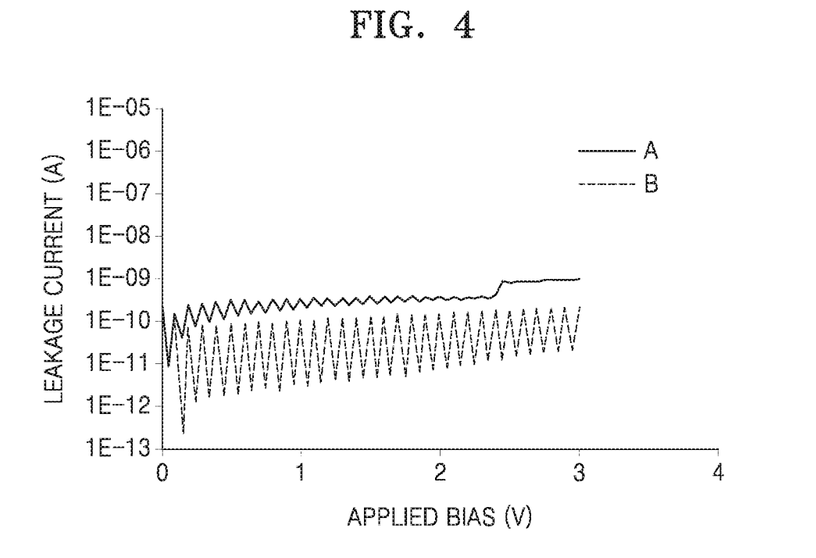
FIG. 4 illustrates a comparison result of leakage current between the general optical modulator of FIG. 1 and the optical modulator according to an example embodiment of FIG. 3.

FIG. 4 illustrates a comparison result of leakage current between the general optical modulator 10 of FIG. 1 and the optical modulator 100 according to an example embodiment of FIG. 3. The mirror layer 12 of the general optical modulator 10 of FIG. 1 was formed of AlNd, and the mirror layer 120 of the optical modulator 100 of FIG. 3 was formed of Au.

In FIG. 4, A represents leakage current generated according to a voltage applied between the mirror layer 12 and the active layer 14 of the general optical modulator 10 of FIG. 1, and B represents leakage current generated according to a voltage applied between the mirror layer 120 and the active layer 140 of the optical modulator 100 according to an example embodiment of FIG. 3. Referring to FIG. 4, leakage current of about 1E-10 A was generated in the general optical modulator 10 of FIG. 1, whereas leakage current of about 1E-11 A was generated in the optical modulator 100 according to an example embodiment of FIG. 3. Accordingly, it is found that leakage current in the optical modulator 100 according to an example embodiment of FIG. 3 was less than that in the general optical modulator 10 of FIG. 1.

Figure 5A:
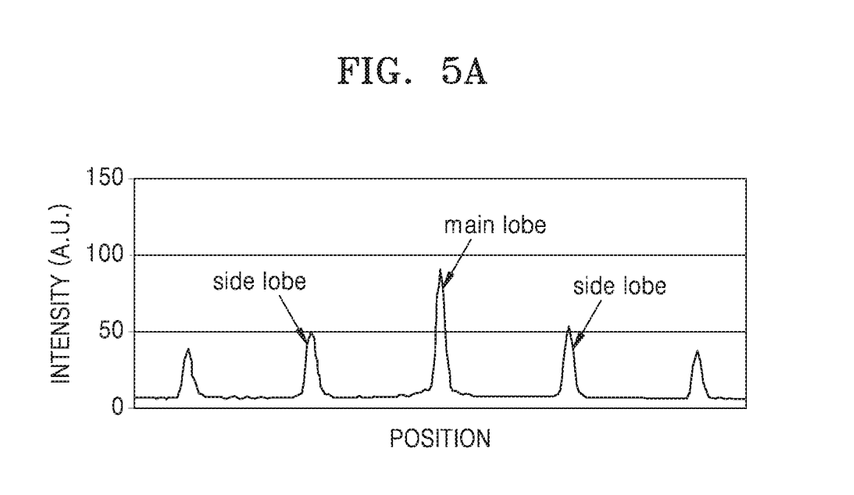
FIG. 5A illustrates a reflected light spectrum of the general optical modulator of FIG. 1.
Figure 5B:
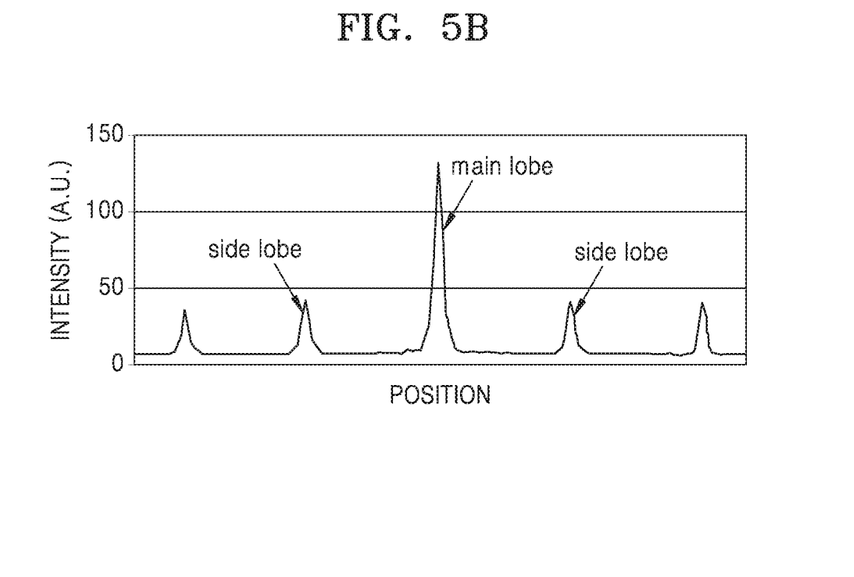
FIG. 5B illustrates a reflected light spectrum of the optical modulator according to an example embodiment of FIG. 3.

FIG. 5A illustrates a reflected light spectrum of the general optical modulator 10 of FIG. 1. FIG. 5B illustrates a reflected light spectrum of the optical modulator 100 according to an example embodiment of FIG. 3. The mirror layer 12 of the general optical modulator 10 of FIG. 1 was formed of AlNd, and the mirror layer 120 of the optical modulator 100 of FIG. 3 was formed of Au.

Referring to FIG. 5A, a ratio of a side lobe to a peak of a main lobe, that is, an optical loss ratio, was about 60% in the general optical modulator 10 of FIG. 1. Referring to FIG. 5B, a ratio of a side lobe to a peak of a main lobe, that is, an optical loss ratio, was about 30% in the optical modulator

100 according to an example embodiment of FIG. 3. Accordingly, it is found that the optical modulator 100 according to an example embodiment of FIG. 3 has higher optical efficiency than an optical efficiency of the general optical modulator 10 of FIG. 1.

Figure 6:
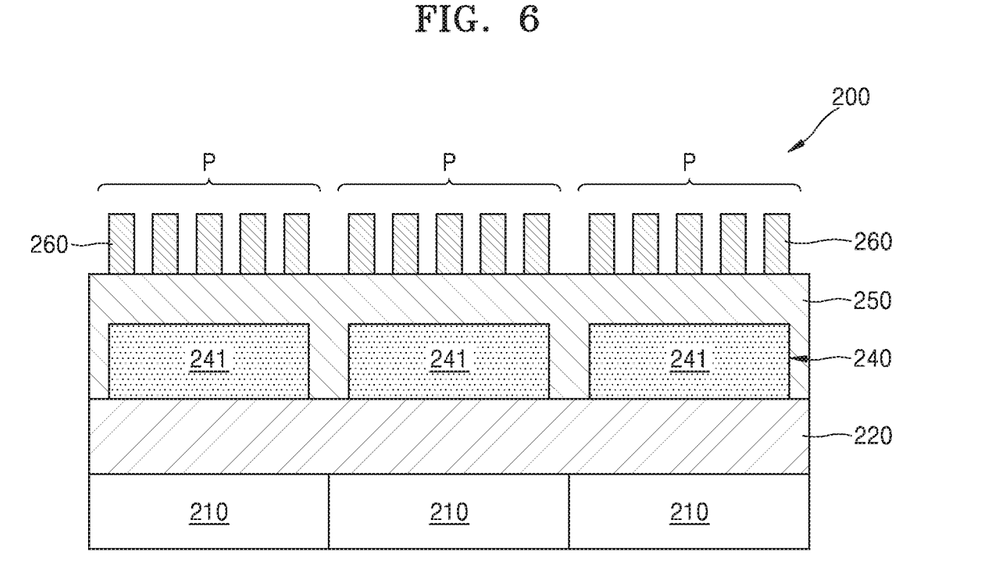
FIG. 6 is a cross-sectional view of an optical modulator according to another example embodiment.

FIG. 6 is a cross-sectional view of an optical modulator 200 according to another example embodiment. While the active layer 140 is provided on the first insulating layer 130 in the optical modulator 100 of FIG. 3, an active layer 240 is provided on a mirror layer 220 in the optical modulator 200. The active layer 240, unit cell drivers 210, the mirror layer 220, and a plurality of antenna patterns 260 of FIG. 6 are similar to those that have been described.

Referring to FIG. 6, the active layer 240 including a plurality of refractive index changing areas 241 that are structurally separated from one another are provided on the mirror layer 220, and an insulating layer 250 is provided over the active layer 240 to cover the plurality of refractive index changing areas 241. The insulating layer 250 may be filled between the plurality of refractive index changing areas 241. The insulating layer 250 may include an insulating material having a resistance equal to or greater than, for example, 1 MΩ.

In order to change a refractive index by applying an electrical signal to the refractive index changing area 241 corresponding to one unit cell P, the unit cell driver 210 may apply an electrical signal between the mirror layer 220 and the antenna pattern 260 located in the unit cell P or may apply an electrical signal between the refractive index changing area 241 and the antenna pattern 260 located in the unit cell P. In this case, the refractive index changing areas 241 may be provided to be electrically separated from one another or electrically connected to one another.

Figure 7:
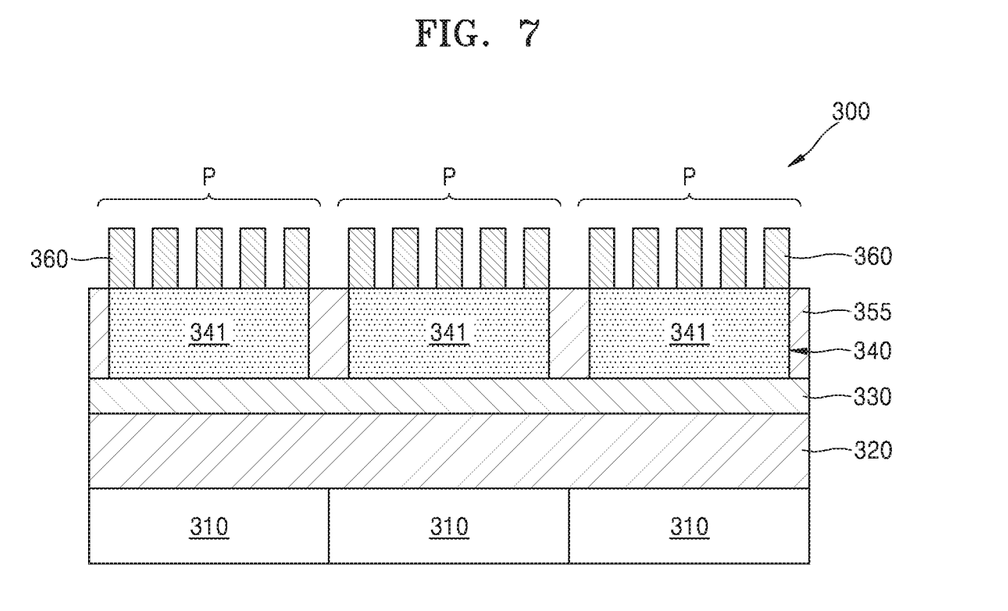
FIG. 7 is a cross-sectional view of an optical modulator according to another example embodiment.

FIG. 7 is a cross-sectional view of an optical modulator 300 according to another example embodiment. While the plurality of antenna patterns 160 are provided on the second insulating layer 150 in the optical modulator 100 of FIG. 3, a plurality of antenna patterns 360 are provided on refractive index changing areas 341 of an active layer 340 in the optical modulator 300 of FIG. 7. The active layer 340, an insulating layer 330, unit cell drivers 310, a mirror layer 320, and the plurality of antenna patterns 360 of FIG. 7 are similar to those that have been described.

Referring to FIG. 7, the active layer 340 including the refractive index changing areas 341 that are structurally separated from one another are provided on a top surface of the insulating layer 330, and the plurality of antenna patterns 360 are provided on a top surface of the active layer 340. An insulating material 355 may be filled between the refractive index changing areas 341. The insulating material 355 may include a material having a resistance equal to or greater than, for example, 1 MΩ.

In order to change a refractive index by applying an electrical signal to the refractive index changing area 341 corresponding to one unit cell P, the unit cell driver 310 may apply an electrical signal between the mirror layer 320 and the antenna pattern 360 located in the unit cell P. In this case, the refractive index changing areas 341 may be provided to be electrically separated from one another or electrically connected to one another. Also, the unit cell driver 310 may apply an electrical signal between the mirror layer 320 and the refractive index changing area 341 located in the unit cell P. In this case, the refractive index changing areas 341 may be provided to be electrically separated from one another.

Figure 8:
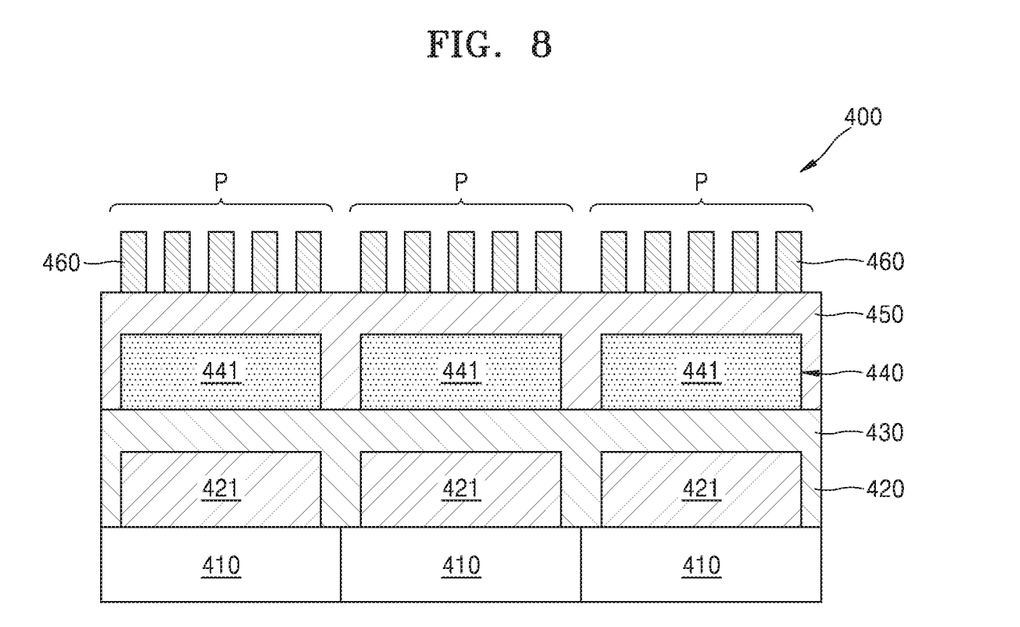
FIG. 8 is a cross-sectional view of an optical modulator according to another example embodiment.

FIG. 8 is a cross-sectional view of an optical modulator 400 according to another example embodiment. While the mirror layer 120 includes a metal mirror that is integrally formed in the optical modulator 100 of FIG. 3, a mirror layer 420 includes a plurality of metal mirrors 421 that are structurally separated from one another in the optical modulator 400 of FIG. 8. An active layer 440, first insulating layer 430 and the second insulating layer 450, unit cell drivers 410, and a plurality of antenna patterns 460 of FIG. 8 are similar to those that have been described.

Referring to FIG. 8, the mirror layer 420 is provided under the active layer 440 including a plurality of refractive index changing areas 441. The mirror layer 420 may include the plurality of metal mirrors 421 that are structurally separated from one another. The metal mirrors 421 may be provided to correspond to the unit cells P. The first insulating layer 430 may be provided between the active layer 440 and the mirror layer 420, and the second insulating layer 450 may be provided between the active layer 440 and the antenna patterns 460. The first insulating layer 430 may be filled between the plurality of metal mirrors 421, and the second insulating layer 450 may be filled between the plurality of refractive index changing areas 441.

The first insulating layer 430 and the second insulating layer 450 are respectively provided between the active layer 440 and the mirror layer 420 and between the active layer 440 and the antenna patterns 460. However, embodiments are not limited thereto, and an insulating layer may be provided only between the active layer 440 and the mirror layer 420, or an insulating layer may be provided only between the active layer 440 and the antenna patterns 460.

Figure 9:
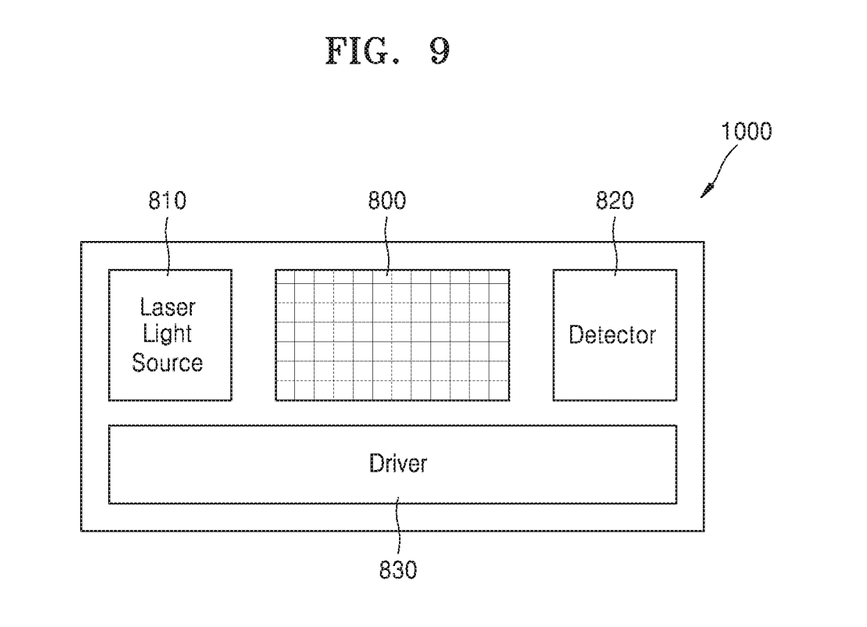
FIG. 9 illustrates a beam steering system according to an example embodiment.

FIG. 9 illustrates a beam steering system 1000 according to an example embodiment. The beam steering system 1000 using an optical modulator according to an example embodiment is illustrated in FIG. 9.

Referring to FIG. 9, the beam steering system 1000 may include a laser light source 810 that emits a laser beam, an optical modulator 800 that steers the laser beam, a detector 820 that detects the steered laser beam, and a driver 830. The driver 830 may include a driving circuit for driving the laser light source 810, the optical modulator 800, and the detector 820.

For example, a laser diode may be used as the laser light source 810. However, this is merely an example, and various other light sources may be used. A laser beam emitted from the laser light source 810 is incident on the optical modulator 800. The optical modulator 800 steers the incident laser beam to a desired position. The optical modulator 800 may include one of the optical modulators 100, 200, 300, and 400. When the laser beam steered by the optical modulator 800 is emitted to and reflected from an object, the detector 820 may detect the reflected laser beam. The beam steering system 1000 may be applied to various fields such as a depth sensor, a three-dimensional (3D) sensor, and a light detection and ranging (LiDAR) sensor.

According to the above example embodiments, because an active layer includes a plurality of refractive index changing areas that are structurally separated and the refractive index changing areas are formed to have a thickness much smaller than a thickness of a mirror layer, a patterning process may be more easily performed, and electrical leakage due to an edge structure may be prevented or reduced due to a relatively small thickness of the refractive index changing areas.

Also, when a metal mirror that is integrally formed to commonly correspond to a plurality of unit cells is used as the mirror layer, a separate patterning process for forming the mirror layer may not be required and the mirror layer may be formed of a metal having a relatively high reflectance such as Au, thereby improving optical properties.

While the above example embodiments have been described, they are merely examples, and it will be understood by one of ordinary skill in the art that various modifications may be made therein.

It should be understood that example embodiments described herein should be considered in a descriptive sense only and not for purposes of limitation. Descriptions of features or aspects within each example embodiment should typically be considered as available for other similar features or aspects in other embodiments.

While example embodiments have been described with reference to the figures, it will be understood by those of ordinary skill in the art that various changes in form and details may be made therein without departing from the spirit and scope as defined by the following claims.

What is claimed is:

1. An optical modulator comprising:
a plurality of unit cells;
an active layer comprising a plurality of refractive index changing areas that are separated from each other in a horizontal direction, each of the plurality of refractive index changing areas having a refractive index that changes based on an electrical signal applied thereto;
a plurality of antenna patterns provided over the active layer;
a mirror layer provided under the active layer opposite to the plurality of antenna patterns; and
an insulating material provided between each of the plurality of refractive index changing areas in the horizontal direction.

2. The optical modulator of claim 1, wherein a distance between adjacent refractive index changing areas of the plurality of refractive index changing areas is within a range of 0.1 μm to 0.5 μm.

3. The optical modulator of claim 1, wherein a distance between adjacent refractive index changing areas of the plurality of refractive index changing areas is equal to or less than a size of each of the plurality of refractive index changing areas.

4. The optical modulator of claim 3, wherein the distance between adjacent refractive index changing areas of the plurality of refractive index changing areas is less than a width of each of the plurality of refractive index changing areas.

5. The optical modulator of claim 4, wherein the distance between adjacent refractive index changing areas of the plurality of refractive index changing areas is less than ½ of the width of each of the plurality of refractive index changing areas.

6. The optical modulator of claim 1, wherein a distance between adjacent refractive index changing areas of the plurality of refractive index changing areas is equal to or less than a distance between adjacent antenna patterns of the plurality of antenna patterns.

7. The optical modulator of claim 1, wherein the plurality of refractive index changing areas are arranged one-dimensionally or two-dimensionally.

8. The optical modulator of claim 1, wherein the plurality of refractive index changing areas are electrically separated from each other.

9. The optical modulator of claim 1, wherein the plurality of refractive index changing areas are electrically connected to each other.

10. The optical modulator of claim 1, wherein the plurality of refractive index changing areas comprise an oxide semiconductor.

11. The optical modulator of claim 10, wherein the oxide semiconductor comprises at least one of indium-tin-oxide (ITO), indium-zinc-oxide (IZO), gallium-indium-zinc-oxide (GIZO), aluminum-zinc-oxide (AZO), gallium-zinc-oxide (GZO), and zinc oxide (ZnO).

12. The optical modulator of claim 1, wherein the mirror layer comprises a metal mirror corresponding to the plurality of unit cells.

13. The optical modulator of claim 1, wherein the mirror layer comprises a plurality of metal mirrors that are separated from each other and correspond to the plurality of unit cells, respectively.

14. The optical modulator of claim 1, wherein the mirror layer comprises at least one of silver (Ag), gold (Au), aluminum (Al), and platinum (Pt).

15. The optical modulator of claim 1, further comprising an insulating layer provided between the active layer and the plurality of antenna patterns or between the active layer and the mirror layer, or both between the active layer and the plurality of antenna patterns and between the active layer and the mirror layer.

16. The optical modulator of claim 15, wherein the insulating layer comprises a material having a resistance equal to or greater than 1 MΩ.

17. The optical modulator of claim 15, wherein the insulating layer comprises silicon dioxide ($SiO_2$), silicon nitride (SiN), aluminum oxide ($Al_2O_3$), zirconium dioxide ($ZrO_2$), hafnium oxide ($HfO_2$), or a combination thereof.

18. The optical modulator of claim 1, wherein at least one antenna pattern of the plurality of antenna patterns is provided to correspond to each of the plurality of unit cells, respectively.

19. The optical modulator of claim 18, wherein
the plurality of antenna patterns comprise at least one of silver (Ag), gold (Au), aluminum (Al), platinum (Pt), titanium nitride (TiN), and tantalum nitride (TaN).

20. The optical modulator of claim 1, further comprising a plurality of unit cell drivers provided under the mirror layer and configured to apply an electrical signal to the plurality of unit cells.

21. A beam steering system comprising:
a laser light source configured to emit a laser beam;
an optical modulator configured to steer the laser beam received from the laser light source, the optical modulator comprising a plurality of unit cells; and
a detector configured to detect the steered laser beam,
wherein the optical modulator comprises:
an active layer comprising a plurality of refractive index changing areas that respectively corresponds to the plurality of unit cells and are separated from each other in a horizontal direction, each of the plurality of refractive index changing areas having a refractive index that changes based on an electrical signal applied thereto;
a plurality of antenna patterns provided over the active layer;
a mirror layer provided under the active layer opposite to the plurality of antenna patterns; and
an insulating material provided between each of the plurality of refractive index changing areas in the horizontal direction.

22. The beam steering system of claim 21, wherein the plurality of refractive index changing areas are arranged one-dimensionally or two-dimensionally.

23. The beam steering system of claim 21, wherein a distance between adjacent refractive index changing areas of the plurality of refractive index changing areas is equal to or less than a width of each of the plurality of refractive index changing areas.

24. The beam steering system of claim 21, wherein a distance between adjacent refractive index changing areas of the plurality of refractive index changing areas is equal to or less than a distance between adjacent antenna patterns of the plurality of antenna patterns.

25. The beam steering system of claim 21, wherein the mirror layer comprises a metal mirror corresponding to the plurality of unit cells.

26. The beam steering system of claim 21, wherein the mirror layer comprises a plurality of metal mirrors that are separated from each other and correspond to the plurality of unit cells, respectively.

27. The beam steering system of claim 21, wherein the optical modulator comprises an insulating layer provided between the active layer and the plurality of antenna patterns or between the active layer and the mirror layer, or both between the active layer and the plurality of antenna patterns and between the active layer and the mirror layer.

28. The beam steering system of claim 21, wherein the optical modulator further comprises a plurality of unit cell drivers provided under the mirror layer and configured to apply an electrical signal to the plurality of unit cells.

29. An optical modulator comprising:
a plurality of unit cells;
an active layer comprising a plurality of refractive index changing areas that are separated from each other in a horizontal direction, each of the plurality of refractive index changing areas having a refractive index that changes based on an electrical signal;
a plurality of antenna patterns provided over the active layer;
a mirror layer provided under the active layer opposite to the plurality of antenna patterns; and
an insulating material provided between each of the plurality of refractive index changing areas in the horizontal direction,
wherein a thickness of each of the plurality of refractive index changing areas is less than a thickness of the mirror layer.

* * * * *